United States Patent [19]

Vaes et al.

[11] Patent Number: 5,607,811
[45] Date of Patent: Mar. 4, 1997

[54] METHOD FOR MAKING A LITHOGRAPHIC PRINTING PLATE USING ASCORBIC ACID DEVELOPER

[75] Inventors: Jos Vaes, Betekom; Luc Wabbes, Mortsel, both of Belgium

[73] Assignee: AGFA-Gevaert, N.V., Mortsel, Belgium

[21] Appl. No.: 569,424

[22] Filed: Dec. 8, 1995

[30] Foreign Application Priority Data

Dec. 28, 1994 [EP] European Pat. Off. ............ 94203778

[51] Int. Cl.$^6$ .................... G03C 8/36; G03C 5/305; G03C 5/30; G03F 7/07
[52] U.S. Cl. ................. 430/204; 430/249; 430/251; 430/456; 430/480; 430/436
[58] Field of Search ............................ 430/204, 249, 430/251, 480, 436, 456

[56] References Cited

U.S. PATENT DOCUMENTS

| | | | |
|---|---|---|---|
| 3,658,527 | 4/1972 | Kunz et al. | 430/249 |
| 3,870,479 | 3/1975 | Kubotera et al. | 430/204 |
| 5,340,691 | 8/1994 | Vaes et al. | 430/204 |
| 5,399,457 | 3/1995 | Davies et al. | 430/204 |
| 5,445,915 | 8/1995 | Vaes | 430/204 |

*Primary Examiner*—Richard L. Schilling
*Attorney, Agent, or Firm*—Breiner & Breiner

[57] ABSTRACT

The present invention provides a method for making a lithographic printing plate according to the silver salt diffusion transfer process comprising the steps of:

- image-wise exposing an imaging element comprising on a support in the order given a photosensitive layer comprising a silver halide emulsion and an image receiving layer containing physical development nuclei in water permeable relationship with said emulsion layer,
- developing said imaging element by means of an alkaline developing solution comprising at least 0.1 mole/l of ascorbic acid as the main developer and at least 0.015 mole/l of an auxiliary developer of the class of the 1-phenyl-3-pyrazolidones in the presence of silver halide solvent(s) characterized in that said developing solution comprises at least 0.003 mole/l of thiosulfate.

9 Claims, No Drawings

METHOD FOR MAKING A LITHOGRAPHIC PRINTING PLATE USING ASCORBIC ACID DEVELOPER

DESCRIPTION

1. Field of the Invention.

The present invention relates to a method for making a lithographic printing plate according to the silver salt diffusion transfer process.

2. Background of the Invention.

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. For example, typical lithographic printing plates are disclosed in EP-A-423,399 and EP-A-410,500.

The DTR-image can be formed in the image-receiving layer of a sheet or web material which is a separate element with respect to the photographic silver halide emulsion material (a so-called two-sheet DTR element) or in the image-receiving layer of a so-called single-support element, also called mono-sheet element, which contains at least one photographic silver halide emulsion layer integral with an image-receiving layer in water-permeable relationship therewith. It is the latter mono-sheet version which is preferred for the preparation of offset printing plates by the DTR method. For example the United Kingdom Patent Specification 1,241,661 discloses a method for the production of a planographic printing plate consisting of a sheet material comprising an outer hydrophilic colloid layer on the surface of which there is concentrated a silver image stemming from an underlying exposed silver halide emulsion layer by the silver complex diffusion transfer reversal process. The silver image formed on the surface is suitable for printing images in, a lithographic printing process using a dampening liquid.

As for other printing plates it is required that the printing plates obtained according to the DTR-process have a high printing endurance, good ink acceptance in the printing areas and no ink acceptance in the non-printing areas (no staining). An appropriate sensitometry, particularly a low minimum density and a high gradient of the printing plate is therefore required.

Furthermore the processing of the exposed imaging element in order to obtain a printing plate comprises the step of developing said exposed imaging element using an alkaline processing liquid in the presence of developing agent(s) and silver halide solvent(s). Nowadays hydroquinone or a derivative thereof are used as developing agent. These compounds are from an ecological viewpoint not interesting. So the use of other more ecologically friendly developing agents is desirable. Ascorbic acid is such an ecologically friendly developer but the results when using ascorbic acid as the main developer in the processing of a lithographic printing plate precursor according to the silver salt diffusion were unsatisfactory.

SUMMARY OF THE INVENTION

It is an object of the present invention to provide a method for making a lithographic printing plate according to the DTR-process with an improved sensitometry, particularly a low minimum density and a high gradient.

It is a further object of the present invention to provide a method for making a lithographic printing plate according to the DTR-process comprising the use of a developing solution containing ascorbic acid as the main developer.

Still further objects of the present invention will become clear from the description hereinafter.

According to the present invention there is provided a method for making a lithographic printing plate according to the silver salt diffusion transfer process comprising the steps of:

image-wise exposing an imaging element comprising on a support in the order given a photosensitive layer comprising a silver halide emulsion and an image receiving layer containing physical development nuclei in water permeable relationship with said emulsion layer, developing said imaging element by means of an alkaline developing solution comprising at least 0.1 mole/l of ascorbic acid as the main developer and at least 0.015 mole/l of an auxiliary developer of the class of the 1-phenyl-3-pyrazolidones in the presence of silver halide solvent(s) characterized in that said developing solution comprises at least 0.003 mole/l of thiosulfate.

DETAILED DESCRIPTION OF THE INVENTION

In order to provide a method for making a lithographic printing plate according to the DTR-process with an improved sensitometry, usually research is directed to improve the sensitometry of the imaging element. Now it has been found by us that said improved sensitometry can be obtained by optimizing the developing solution.

According to the invention said developing solution comprises at least 0.003 mole/l, preferably at least 0.005 mole/l, more preferably at least 0.01 mole/l, most preferably at least 0.02 mole/l of thiosulfate. The upper limit is not so important but is preferably not higher than 0.06 mole/l. Preferably said thiosulfate is sodium thiosulfate, potassium thiosulfate or ammonium thiosulfate.

According to the invention said developing solution comprises as the main developer ascorbic acid in a concentration of at least 0.1 mole/l, preferably in a concentration of at least 0.15 mole/l, more preferably in a concentration of at least 0.3 mole/l.

According to the invention said developing solution comprises at least 0.015 mole/l, preferably at least 0.025 mole/l, most preferably at least 0.03 mole/l of an auxiliary developer of the class of the 1-phenyl-3-pyrazolidones (also called phenidones). The upper limit is not so important but is preferably not higher than 0.05 mole/l.

Said auxiliary developer of the class of the 1-phenyl-3-pyrazolidinones are e.g. 1-phenyl-3-pyrazolidone, 1-phenyl-4-monomethyl-3-pyrazolidone, 1-phenyl-4,4-dimethyl-3-pyrazolidone and 1-phenyl-3-pyrazolidones of which the aqueous solubility is increased by a hydrophilic substituent such as e.g. hydroxy, amino, carboxylic acid group, sulphonic acid group etc.. Examples of 1-phenyl-3-pyrazolidones subsituted with one or more hydrophilic groups are e.g. 1-phenyl-4-methyl-4-hydroxymethyl-3-pyrazolidone, 1-phenyl-4,4'-dihydroxymethyl-3-pyrazolidone, 1-(4-carboxyphenyl)-4,4-dimethyl-3pyrazolidone etc.

Preferably said alkaline developing solution contains a mono- or polysaccharide such as cyclodextrine as a preservative for ascorbic acid.

The alkaline developing solution used for developing the imaging element in accordance with the method of the present invention preferably contains a further silver halide solvent outside thiosulfate as the main silver halide solvent. It is also possible that a further silver halide solvent is incorporated in the imaging element. Preferably the silver halide solvent in the developing solution is used in an amount between 0.1% by weight and 10% by weight and more preferably between 0.5% by weight and 8% by weight.

A suitable main silver halide solvent for use in connection with the present invention is thiocyanate in an amount ranging from 5 g to 20 g per liter. Other interesting main silver halide complexing agents are e.g. sulphite, amines, 2-mercaptobenzoic acid, cyclic imide compounds such as e.g. uracil, 5,5-dialkylhydantoins, alkyl sulfones and oxazolidones.

Further main silver halide solvents for use in connection with the present invention are alkanolamines. Said alkanolamines may be present in the alkaline processing liquid in a concentration preferably between 0.1% and 5% by weight. However part or all of the alkanolamine can be present in one or more layers of the imaging element.

Still other preferred further main silver halide solvents for use in connection with the present invention are thioethers, preferably di- or poly-thioethers as disclosed in e.g. U.S. Pat. No. 4,960,683 and EP-A 554,585.

Still further main suitable silver halide solvents are mesoionic compounds, preferably 1,2,4-triazolium-3-thiolates as disclosed in e.g. EP-A 554,585.

Combinations of different silver halide solvents can be used and it is also possible to incorporate-at least one main silver halide solvent into a suitable layer of the imaging element and to add at least one other silver halide solvent to the developing solution. Preferably they are comprised in the alkaline processing liquid.

The pH of the alkaline developing solution is preferably between 9 and 14, more preferably between 10 and 13 and may be established by an organic and/or inorganic alkali agent. Examples of suitable alkali agents are e.g. sodium hydroxide, carbonates, phosphates, alkanolamines or mixtures thereof.

Development acceleration can be accomplished with the aid of various compounds to the alkaline developing solution and/or one or more layers of the photographic element, preferably polyalkylene derivatives having a molecular weight of at least 400 such as those described in e.g. U.S. Pat. Nos. 3,038,805, 4,038,075, 4,292,400, 4,975,354.

The alkaline developing solution preferably also contains a preserving agent having antioxidation activity, e.g. sulphite ions. Further may be present a thickening agent, fog inhibiting agents e.g. a benzotriazole which is known to improve the printing endurance, calcium-sequestering compounds, anti-sludge agents, development accelerators and hardeners including latent hardeners.

The development step is preferably followed by a neutralization of the surface of the imaged element by guiding the element through a neutralization liquid having a pH between 4 and 8. The neutralization liquid preferably contains a buffer e.g. a phosphate buffer, a citrate buffer, an amine or a mixture thereof. The neutralization solution can further contain bactericides, e.g. phenol, thymol or 5-bromo-5-nitro-1,3-dioxan as described in EP-150,517, wetting agents e.g. saponins or pluronics etc. The liquid can also contain substances which influence the hydrophobic/hydrophilic balance of the printing plate obtained after processing of the DTR element, e.g. silica. Finally the neutralization solution can contain wetting agents, preferably compounds containing perfluorinated alkyl groups.

According to the present invention the alkaline processing and/or neutralizing solution preferably also contains hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or-only slightly soluble in water. Generally these compounds contain a mercapto group or thiolate group and one or more hydrophobic substituents e.g. an alkyl group containing at least 3 carbon atoms. Preferred hydrophobizing agents are mercapto-1,3,4-thiadiazoles as described in DE-A 1,228,927 and in U.S. Pat. No. 4,563,410, 2-mercapto-5-alkyl-oxa-3,4-diazole and long chain (at least 5 carbon atoms) alkyl substituted mercaptotetrazoles. Particularly preferred compounds are 5-n-heptyl-2-mercapto-1,3,4-oxadiazol and 3-mercapto-4-acetamido-5-n-heptyl-1,2,4-triazole.

According to the present invention the hydrophobizing agents are contained in the alkaline processing solution or the neutralizing solution in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/l.

According to the present invention the imaging element can be information-wise exposed in an apparatus according to its particular application, e.g. a conventional process camera containing a conventional light source or a laser or LED containing device.

The imaging element in connection with the present invention for preparing a lithographic printing plate essentially contains on a support in the order given a photosensitive layer containing a silver halide emulsion and an image receiving layer containing physical development nuclei in water permeable relationship with said emulsion layer.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or complexed silver ions.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use-an organic resin support e.g. cellulose nitrate film, cellulose acetate film, poly(vinyl acetal) film, polystyrene film, poly-(ethylene terephthalate) film, polycarbonate film, polyvinyl-chloride film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminium may also be used in accordance with the present invention.

The photographic silver halide emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

According to the present invention the emulsion or emulsions preferably consist principally or totally of silver chloride. A fraction of silver bromide may be present ranging from 1 mole % to 40 mole %. The emulsions having more than 2 mole % of silver bromide preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated.

The average size of the silver halide grains may range from 0.10 to 0.70 μm, preferably from 0.25 to 0.45 μm.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $0.5*10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The emulsions of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensitizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual stabilizers e.g. azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168, 4,311,787 and DE-P 2,453,217.

More details about the composition, preparation and coating of silver halide emulsions can be found in e.g. Product Licensing Index, Vol. 92, December 1971, publication 9232, p. 107–109.

Apart from negative-working silver halide emulsions that are preferred for their high light-sensitivity, use can be made also of direct-positive silver halide emulsions that produce a positive silver image.

For instance, direct-positive silver halide emulsions that mainly forms an internal image as described in e.g. EP-A 365,926 and U.S. Pat. No. 3,062,651 may be employed. Alternatively, prefogged direct-positive silver halide emulsions with internal or, more preferably, with external electron traps as disclosed in EP-A 94201899.5 and EP-A 481,562 are also suitable for use in connection with the present invention.

For instance, direct-positive emulsions of the type described in U.S. Pat. No. 3,062,651 may be employed. In direct-positive emulsions a non-hardening fogging agent such as stannous chloride and formamidine sulphinic acid can be used.

The layer containing physical development nuclei can be free of hydrophilic binder but preferably comprises amounts up to 80% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form.

Between the support and the silver halide emulsion layer there is preferably provided a base layer that preferably contains an anti-halation substance such as e.g. light-absorbing dyes absorbing the light used for image-wise exposure of the imaging element. As alternative finely divided carbon black can be used as an anti-halation substance. On the other hand, in order to gain sensitivity, light reflecting pigments, e.g. titaniumdioxide can be present in the base layer. Further this layer can contain hardening agents, matting agents, e.g. silica particles, and wetting agents. Suitable matting agents preferably have an average diameter of 2–10 μm and more preferably between 2 μm and 5 μm. The matting agents are generally used in a total amount in the imaging element of 0.1 g/m² to 2.5 g/m². At least part of these matting agents and/or light reflection pigments may also be present in the silver halide emulsion layer and/or in the cover layer. As a further alternative the light reflecting pigments may be present in a separate layer provided between the antihalation layer and the photosensitive silver halide emulsion layer. Like the emulsion layer the base layer is coated preferably at a pH value near the isoelectric point of the gelatin in the base layer.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack and can be transparent or opaque:

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value near the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Examples of suitable surface-active agents are described in e.g. EP 545452. Preferably compounds containing perfluorinated alkyl groups are used.

The photographic material of the present invention may further comprise various other additives such as e.g. compounds improving the dimensional stability of the photographic element, UV-absorbers, spacing agents and plasticizers.

Suitable-additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth)acrylates, sulphoalkyl (meth)acrylates, and styrene sulphonic acids.

The present invention will now be illustrated by the following example without however limiting it thereto. All parts are by weight unless otherwise specified.

EXAMPLE 1

Preparation of the silver halide emulsion coating solution.

A silver chlorobromide emulsion composed of 98.2 mole % of chloride and 1.8 mole % of bromide was prepared by the double jet precipitation method. The average silver halide grain size was 0.4 μm (diameter of a sphere with equivalent volume) and contained Rhodium ions as internal dopant. The emulsion was orthochromatically sensitized and stabilized by a 1-phenyl-5-mercapto-tetrazole.

A base layer coating solution was prepared having the following composition:
gelatin 5.5%
carbon black 0.76%
silica particles (5 μm) 1.6%

Preparation of the imaging element:

The emulsion coating solution and base layer coating solution were simultaneously coated by means of the cascade coating technique to a polyethylene terephthalate support provided with a pack of two backing layers such that the base layer coating was coated directly to the side of the support opposite to the side containing said backing layers. The emulsion layer was coated such that the silver halide coverage expressed as $AgNO_3$ was 1.5 g/m² and the gelatin content was 1.5 g/m². The base layer was coated such that the amount of gelatin in the coated layer was 3 g/m².

The layer nearest to the support of the backing layer pack contained 0.3 g/m² of gelatin and 0.5 g/m² of the antistatic agent co(tetraallyloxyethane/methacrylate/acrylic acid-K-salt) polymer. The second backing layer contained 4 g/m² of gelatin, 0.15 g/m² of a matting agent consisting of transparent spherical polymeric beads of 3 micron average diameter according to EP 0080225, 0.05 g/m² of hardening agent triacrylformal and 0.021 g/m² of wetting agent $F_{15}C_7$—COONH$_4$.

The thus obtained element was dried and subjected to a temperature of 40° C. for 5 days and then the emulsion layer was overcoated with a layer containing PdS as physical development nuclei and formaldehyde at 100 mg/m².

The following processing solutions were prepared:

TABLE 1

| Developing solutions 1–5 | | | | | | |
|---|---|---|---|---|---|---|
| Developing Solution | 1 | 2 | 3 | 4 | 5 | 6 |
| Na$_2$SO$_3$ (g) | 50 | 50 | 50 | 50 | 50 | 50 |
| NaOH (g) | 30 | 30 | 30 | 30 | 30 | 30 |
| Ethyleneglycol (ml) | 30 | 30 | 30 | 30 | 30 | 30 |
| KBr (g) | 1 | 1 | 1 | 1 | 1 | 1 |
| Monomethyl-aminoethanol (ml) | 15 | 15 | 15 | 15 | 15 | 15 |
| 3-mercapto-4-acetamido-5 n.heptyl-1,2,4-triazole (g) | 0.8 | 0.8 | 0.8 | 0.8 | 0.8 | 0.8 |
| Sodium sequestrene (g) | 2 | 2 | 2 | 2 | 2 | 2 |
| Ascorbic acid (g) | 32 | 32 | 32 | 32 | 32 | 100 |
| Na$_2$S$_2$O$_3$ (mmole/l) | 0 | 25 | 0 | 25 | 25 | 25 |
| KSCN (g/l) | 12 | 16 | 12 | 12 | 12 | 12 |
| 4-methyl-phenidone (mmole/l) | 16 | 16 | 35 | 35 | 0 | 0 |
| 4-hydroxymethyl-4-methyl phenidone (mmole/l) | 0 | 0 | 0 | 0 | 35 | 35 |
| water to (l) | 1 | 1 | 1 | 1 | 1 | 1 |
| pH | 13.2 | 13,2 | 13.2 | 13,2 | 13,2 | 13,2 |

Neutralization solution:
citric acid 10 g
sodium citrate 35 g
sodium sulphite anh. 5 g
phenol 50 mg
water to make 1 l Five samples of the above described imaging elements were image-wise exposed and processed at 25° C. respectively one in each of the above described alkaline developing solution 1–5, subsequently neutralized at 25° C. with the neutralization solution described above and dried. The resulting sensitometry of the 5 samples is given in table 2.

TABLE 2

| | Sensitometry | | | |
|---|---|---|---|---|
| Developer | D$_{min}$ | G$_1$ | G$_2$ | S |
| 1 | 0.82 | 0.49 | 0.48 | 1.33 |
| 2 | 0.75 | 0.65 | 0.52 | 1.33 |
| 3 | 0.83 | 0.50 | 0.48 | 1.40 |
| 4 | 0.72 | 0.71 | 0.60 | 1.40 |
| 5 | 0.73 | 0.72 | 0.56 | 1.40 |
| 6 | 0.73 | 0.91 | 0.62 | 1.52 |

G$_1$: Gradient between 25% and 75% of the maximum density
G$_2$: Gradient between 60% and 85% of the maximum density S: Sensitivity measured at a density = $\frac{D_{max} - D_{min}}{2}$ It is clear from the results of table 2 that an exposed imaging elements developed in developing solution 1 or 3 (developing solutions without thiosulfate=comparative developing solutions)) have a higher minimum density and much lower gradient values (surely G$_1$, but also the less important G$_2$) than samples developed in developing solutions 2, 4, 5 and 6 (developing solutions containing 0.025 mole/l of sodium thiosulfate=developing solutions according to the invention). The effect is even more outspoken with the developing solutions 4 and 5 than with the developing solution 2, which first solutions contain a higher amount of a phenidone and most outspoken for developing solution 6, which further contains a higher amount of ascorbic acid. Furthermore, also the sensitivity of the samples developed in the developing solutions 4, 5 and 6 is about 0.1 log It higher than those of the samples processed in the developing solutions 1 or 3, which first solutions contain a higher amount of a phenidone.

EXAMPLE 2

An imaging element was prepared in an identical way as the imaging element of example 1.

The following processing solutions were prepared:

TABLE 3

| Developing solution | 7 | 8 |
|---|---|---|
| carboxymethyl-cellulose (g) | 4 | 4 |
| Al$_2$(SO$_4$)$_3$.18H$_2$O (g) | 8 | 8 |
| NaOH (g) | 33 | 33 |
| Na$_2$SO$_3$ (g) | 120 | 120 |
| KBr | 0.75 | 0.75 |
| Ascorbic acid (g) | 50 | 50 |
| 4-methyl-phenidone (mmole/l) | 40 | 40 |
| amino-ethyl-amino-ethanol (ml) | 10 | 10 |
| Thiosalicyclic acid (g) | 0.06 | 0.06 |
| Uracil (g) | 0.85 | 0.85 |
| Na$_2$S$_2$O$_3$ (mmole/l) | 0 | 25 |

The neutralizing solution was identical to that of example 1.

Two samples of the above described imaging elements were image-wise exposed and processed at 25° C. respectively one in each of the above described alkaline developing solution 1–5, subsequently neutralized at 25° C. with the neutralization solution described above and dried. The resulting sensitometry of the 2 samples is given in table 4.

TABLE 4

| | Sensitometry | | |
|---|---|---|---|
| Developing Solution | D$_{min}$ | G$_1$ | G$_2$ |
| 7 | 0.67 | 0.58 | 0.50 |
| 8 | 0.55 | 0.72 | 0.68 |

It is clear from the results of table 4 that an exposed imaging element developed in developing solution 7 (developing solution without thiosulfate=comparative developing solution) has a higher minimum density and much lower gradient values (as well G$_1$ as G$_2$) than a sample developed in the developing solution 8 (a developing solution containing 0.025 mole/l of thiosulfate=developing solution according to the invention.

We claim:

1. A method for making a lithographic printing plate according to the silver salt diffusion transfer process comprising the steps of:
    image-wise exposing an imaging element comprising on a support in the order given a photosensitive layer comprising a silver halide emulsion and an image receiving layer containing physical development nuclei in water permeable relationship with said emulsion layer, developing said imaging element by means of an alkaline developing solution comprising at least 0.1 mole/l of ascorbic acid as the main developer and at least 0.015 mole/l of an auxiliary developer of the class of the 1-phenyl-3-pyrazolidones in the presence of silver halide solvent(s) wherein said developing solution comprises at least 0.003 mole/l of thiosulfate and is free of polyhydroxybenzenes.

2. A method according to claim 1 wherein said developing solution comprises at least 0.005 mole/l of thiosulfate.

3. A method according to claim 1 wherein said developing solution comprises thiosulfate in the range from 0.01 mole/l to 0.06 mole/l.

4. A method according to claim 1 wherein said developing solution comprises ascorbic acid in a concentration of at least 0.15 mole/l.

5. A method according to claim 1 wherein said developing solution comprises at least 0.025 mole/l of an auxiliary developer of the class of the 1-phenyl-3-pyrazolidones.

6. A method according to claim 1 wherein said developing solution contains a further silver halide solvent outside thiosulfate as the main silver halide solvent.

7. A method according to claim 1 wherein said further silver halide solvent is thiocyanate in an amount in the range from 5 g/l to 20 g/l.

8. A method according to claim 1 wherein said further silver halide solvent is an aminoalcohol in an amount in the range from 1 g/l to 50 g/l.

9. A method according to claim 1 wherein said alkaline processing solution comprises a meso-ionic compound.

* * * * *